United States Patent [19]

Witte

[11] 3,974,485
[45] Aug. 10, 1976

[54] PROCESS FOR OPERATING A CHARGE SHIFT STORE

[75] Inventor: Juergen Witte, Neuried, Germany

[73] Assignee: Siemens Aktiengesellschaft, Berlin & Munich, Germany

[22] Filed: Sept. 12, 1974

[21] Appl. No.: 505,332

[30] Foreign Application Priority Data

Sept. 26, 1973 Germany............................ 2348490

[52] U.S. Cl...................... 340/173 DR; 307/211 C; 340/173 RC
[51] Int. Cl.²................... G11C 7/00; G11C 21/00; G11C 11/34
[58] Field of Search........... 307/304, 221 C; 357/24; 340/173 R, 173 DR, 173 CA, 173 RC

[56] References Cited
UNITED STATES PATENTS

| | | | |
|---|---|---|---|
| 3,760,202 | 9/1973 | Kosonocky | 307/304 |
| 3,858,184 | 12/1974 | De Vries | 340/173 DR |
| 3,859,640 | 1/1975 | Eberlein | 340/173 DR |

OTHER PUBLICATIONS

Terman, Avoidance of Refresh Times in Dynamic Memories, IBM Technical Disclosure Bulletin, vol. 15, No. 7, 12/72, pp. 2056–2058.

Harroun, Storage Refresh Control and Synchronization, IBM Technical Disclosure Bulletin, vol. 15, No. 1 6/72, pp. 257–258.

*Primary Examiner*—Stuart N. Hecker
*Attorney, Agent, or Firm*—Hill, Gross, Simpson, Van Santen, Steadman, Chiara & Simpson

[57] ABSTRACT

In a process for operating a charge shift store in which, for the regeneration of the data contained in storage loops, the data is advanced over regeneration stages in dependence upon a regeneration pulse train. In the input and output processes, items of data are written in via an input stage and read out via an output stage in dependence upon an operating pulse train. The items of data contained in the storage elements of the individual storage loops are regenerated in a full cycle only after the expiration of the maximum storage time of the storage elements. The operating pulse train is employed as a regeneration pulse train in this process.

2 Claims, 2 Drawing Figures

PROCESS FOR OPERATING A CHARGE SHIFT STORE

BACKGROUND OF THE INVENTION

1. Field of the Invention

This invention relates to a process for operating a charge shift store, in which, for the regeneration of the items of data contained in storage loops, these items of data are advanced over regeneration stages in dependence upon a regeneration timing signal, and in which the input and output items of data are input via an input stage and output via an output stage in dependence upon an operating timing signal.

2. Description of the Prior Art

Charge shift arrangements (CCD charge coupled devices) are well known in the art. For an insight to these devices, one may refer to the periodical "Electronics", June 21, 1971, Pages 50–58, and to the periodical Bell System Technical Journal, Vol. 940, No. 4, 1970, Pages 587–593. Charge shift arrangements basically consist of a semiconductor substrate, an electrically insulating layer arranged on the substrate, and metal electrodes arranged on the insulating layer. The metal electrodes are isolated from one another. The pinciple of charge shift arrangements is based upon the connection of suitably selected voltages to these metal electrodes in order to provide, at the boundary between the insulating layer and the semiconductor substrate, favorable potential conditions in which minority charge carriers can be stored. A special write-in device feeds minority charge carriers into these potential wells at a suitable time, or blocks the minority charge carrier supply, as dictated by the data to be written in. Therefore, charge shift arrangements of this kind can be used with particular advantage for shift registers.

It is also known in the art to employ charge shift arrangements as stores. For this purpose, an input stage is provided at an input end of the charge shift arrangement which is, in this case, constructed as a shift register, an output stage is connected at the output end of this shift register, and a regeneration stage is provided between the output end and the input end of the shift register. A construction of this type is known as a storage loop. As the individual storage elements of such a storage loop can store the data only for a specific length of time, the store data is constantly recycled. Consequently, the store data is also conducted over the regeneration stage and is regenerated with each cycle. This type of operation of a charge shift store produces a high power loss. Therefore, it has been proposed that the power loss be reduced in that, apart from the high frequency operating timing signal, for non-addressed storage loops a lower frequency regeneration pulse train is used which allows the data of non-addressed storage loops to be constantly recycled, and therefore provides a continuous regeneration of data. However, the power loss is relatively high in this mode of operation.

For further information which generally concerns the process and apparatus of the present invention, one may take reference to the 1973 IEEE International Solid-State Circuits Conference, the Digest of Technical Papers, February 1973, Pages 136, 137 and 210, and The Bell System Technical Journal, Vol. 52, No. 2, February 1973, Pages 147–168.

SUMMARY OF THE INVENTION

The object of the present invention is to provide a process for operating a charge shift store by means of which the power loss can be substantially reduced.

This object is realized in that the items of data contained in the storage elements of the individual storage loops are always regenerated in a cycle only after the expiration of the storage time of the storage elements, and that the operating pulse train is employed as the regeneration pulse train.

The operating pulse train refers to that pulse train which is used to write in or read out data from the storage loop. The regeneration pulse train is the pulse train with which the data stored in the storage loops is conducted, for purposes of regeneration, over the regeneration stages. According to the invention, the operating pulse train is employed as the regeneration pulse train. However, the regeneration pulse train (in this case the operating pulse train) is connected to a storage loop only when the maximum storage time of the storage elements of this storage loop has expired. The storage time can amount to, for example, between 10 milliseconds and one second. In the interim, the storage loops are at rest. Therefore, the charge shift store is operated in accordance with the start-stop principle.

Storage loops in which data is written, or from which data is withdrawn, can be subject to regeneration of the data associated therewith, in which case no special regeneration cycle of the data is required.

It is advantageous to divide the total number of storage loops of the charge shift store into zones and in each case to regenerate only one zone at a time. With this approach, data can be written into or read out from the storage loops of the other zones.

BRIEF DESCRIPTION OF THE DRAWING

Other objects, features and advantages of the invention, its organization, construction and operation will be best understood from the following detailed description taken in conjunction with the accompanying drawing, on which.

DESCRIPTION OF THE PREFERRED EMBODIMENT

Figure 1:
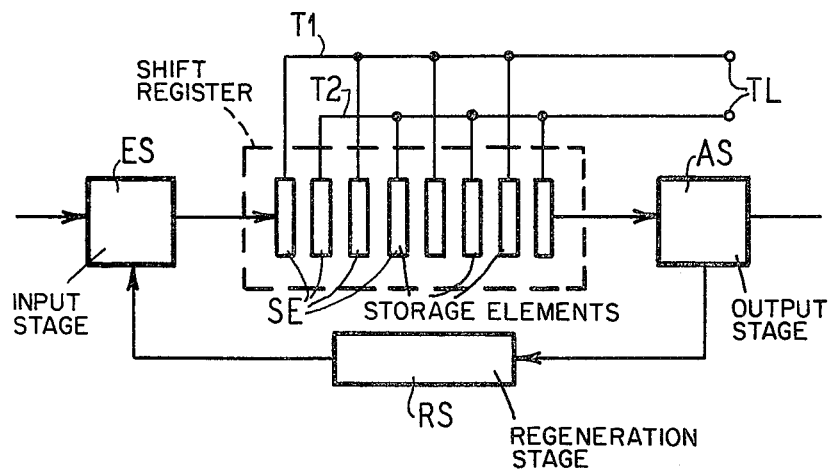
FIG. 1 is a schematic illustration of a storage loop constructed for control in accordance with the principles of the invention.

Referring to FIG. 1, a series of storage elements SE are constructed and arranged to form a shift register. An input stage ES is arranged at the input end of the shift register, an output stage AS is arranged at the output of the shift register, and the output stage AS is connected to the input stage ES via a regeneration stage RS. In order to shift data from one storage element to another, two pulse trains T1 and T2 are supplied via pulse train lines TL. Charge shift arrangements which operate with two pulse trains T1 and T2 are well known in the art.

For the write-in and read-out of data, an operating pulse train T1, T2 is connected to the pulse train lines TL. The data which is to be written in passes from the input stage ES into the storage elements of the register. An item of data is read out accordingly via the output stage AS.

However, the operating pulse train T1, T2 is not always connected to the lines TL. Storage loops which are not addressed remain at rest until the maximum storage time of the storage elements has expired. Then, for the regeneration of the data contained in the storage elements of the storage loop, the operating pulse train T1, T2 is connected to the pulse train lines TL and the data is advanced through the storage elements and over the regeneration stages RS in a full cycle. At the end of the cycle the data are to be found, regenerated, in the same storage element as before.

Figure 2:
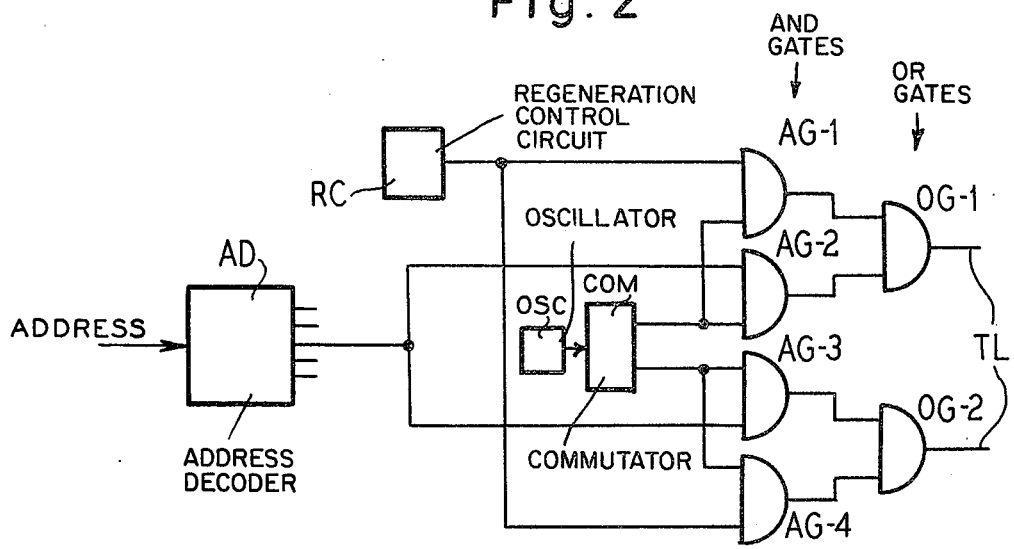
FIG. 2 is a schematic diagram of a logic circuit for providing control pulses to the circuit of FIG. 1.

Referring to FIG. 2, a circuit for providing the pulse train T1, T2 is illustrated as comprising a pair of OR gates OG1, OG2, a plurality of AND gates AG1–AG4, a regeneration control circuit RC, a commutator COM, an oscillator OSC and an address decoder AD.

A signal which is applied to the AND gates AG2 and AG3 from the address decoder AD on a output line depending on which storage loops are to be controlled. This action provides control for the AND gates with respect to timing signals.

The timing signals are supplied by the oscillator OSC, which may be of conventional design, to the commutator COM, which may also be of conventional design. The commutator COM alternately provides the timing signal at its first output and then at its second output to control the operation of the AND gates AG2 and AG3. This operation provides the operating pulse train for reading and writing.

The regenerating pulse train is derived from the operating pulse train with the aid of the regeneration control circuit RC which also controls the AND gates AG1 and AG4. The regeneration control circuit RC may be constructed, for example, as a astable multivibrator which operates between two conditions. The multivibrator may convert to a first output condition at the instant of expiration of the maximum storage time, and only when the loop is regenerated does it return to its second output condition. The multivibrator changes states only when the maximum storage time has just expired.

The process of the invention has certain essential advantages. First of all, the start-stop operation drastically reduces the power loss; it therefore possible to integrate a larger storage capacity on a semi-conductor chip. Also, a standard pulse train system can be realized more simply than two pulse trains with different frequencies, one for the operating pulse train and one for the regeneration pulse train. If the charge shift stores employed as a page store of a virtual storage system, the access time can be reduced because the page can always start at the read/out write/in stage of the storage loops.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a process for operating a charge shift store of individual storage elements for which data is regenerated in a regeneration stage of a storage loop under the control of a regeneration pulse train and in which data is written into and read out from respective input and output stages of the charge shift store under the control of an operation pulse train, the improvement comprising the steps of:

regenerating the items of data contained in the individual storage elements in a full cycle only upon the expiration of the maximum storage time of the storage elements, and applying the operating pulse train as the regeneration pulse train to control regeneration of data.

2. In an apparatus of the type wherein a charge shift store of individual storage elements has the stored data regenerated in a regeneration stage of a storage loop under the control of a regeneration pulse train and wherein data is written into and read out from respective input and output stages of the charge shift store under the control of an operation pulse train, the improvement comprising:

means for regenerating the items of data contained in the individual storage elements in a full cycle only upon the expiration of the maximum storage time of the storage elements, including means for applying the operating pulse train as the regeneration pulse train to control regeneration of data.

* * * * *